(12) United States Patent
Betancourt

(10) Patent No.: US 8,058,884 B2
(45) Date of Patent: Nov. 15, 2011

(54) SYSTEM AND METHOD FOR MEASURING A CAPACITANCE AND SELECTIVELY ACTIVATING AN INDICATING TRANSDUCER

(75) Inventor: Rafael Betancourt, Santa Clara, CA (US)

(73) Assignee: Synaptics Incorporated, Santa Clara, CA (US)

( * ) Notice: Subject to any disclaimer, the term of this patent is extended or adjusted under 35 U.S.C. 154(b) by 756 days.

(21) Appl. No.: 12/195,036

(22) Filed: Aug. 20, 2008

(65) Prior Publication Data

US 2010/0045310 A1  Feb. 25, 2010

(51) Int. Cl.
*G01R 27/26* (2006.01)
(52) U.S. Cl. ........................... 324/686; 324/661
(58) Field of Classification Search ............. 324/686
See application file for complete search history.

(56) References Cited

U.S. PATENT DOCUMENTS

| | | | |
|---|---|---|---|
| 4,386,312 A | 5/1983 | Briefer | |
| 4,831,325 A * | 5/1989 | Watson, Jr. | 324/678 |
| 5,235,174 A | 8/1993 | Ikeda et al. | |
| 6,239,788 B1 | 5/2001 | Nohno et al. | |
| 7,157,982 B2 | 1/2007 | Panzer | |
| 2001/0020578 A1 | 9/2001 | Baier | |
| 2003/0001223 A1 | 1/2003 | Gremm | |
| 2007/0046639 A1 | 3/2007 | Swedin | |
| 2007/0208529 A1 | 9/2007 | Koch et al. | |
| 2008/0316182 A1 * | 12/2008 | Antila et al. | 345/173 |

OTHER PUBLICATIONS

International Search Report PCT/US2009/053117 dated Nov. 17, 2009.

* cited by examiner

*Primary Examiner* — Thomas Valone
(74) *Attorney, Agent, or Firm* — Ingrassia Fisher & Lorenz, P.C.

(57) ABSTRACT

Systems and methods for sensing capacitances that are applicable to proximity sensor devices are provided. The systems and methods provide decreased implementation costs by reducing the number of output terminals required. Specifically, the systems and methods for sensing capacitances provide the ability to selectively activate indicating transducers, such as LEDs, with the same output terminals used for sensing capacitances. This reduces the need for additional, dedicated output terminals for activating the indicating transducers. As such, the system and method provides for efficient use of resources in proximity sensor devices.

24 Claims, 6 Drawing Sheets

SYSTEM AND METHOD FOR MEASURING A CAPACITANCE AND SELECTIVELY ACTIVATING AN INDICATING TRANSDUCER

FIELD OF THE INVENTION

This invention generally relates to proximity sensor devices, and more specifically relates to capacitance measuring in proximity sensor devices.

BACKGROUND OF THE INVENTION

Proximity sensor devices (also commonly called touch pads or touch sensor devices) are widely used in a variety of electronic systems. One type of proximity sensor is a capacitive proximity sensor device. A capacitive proximity sensor device typically includes a sensing region, often demarked by a surface, and uses capacitive technology to determine the presence, location and/or motion of one or more fingers, styli, and/or other objects. The capacitive proximity sensor device, together with finger(s) and/or other object(s), can be used to provide an input to the electronic system. For example, proximity sensor devices are used as input devices for larger computing systems, such as those found integral within notebook computers or peripheral to desktop computers. Capacitive proximity sensor devices are also used in smaller systems, including: handheld systems such as personal digital assistants (PDAs), remote controls, communication systems such as wireless telephones and text messaging systems. Increasingly, proximity sensor devices are used in media systems, such as CD, DVD, MP3, video or other media recorders or players.

A user generally operates a capacitive proximity sensor device by placing or moving one or more fingers, styli, and/or objects, near a sensing region of one or more sensors located on or in the sensor device. This creates a capacitive effect upon a carrier signal applied to the sensing region that can be detected and correlated to positional information (such as the position(s) or proximity or motion or presences or similar information) of the stimulus/stimuli with respect to the sensing region. This positional information can in turn be used to select, move, scroll, or manipulate any combination of text, graphics, cursors and highlighters, and/or any other indicator on a display screen. This positional information can also be used to enable the user to interact with an interface, such as to control volume, to adjust brightness, or to achieve any other purpose.

Although capacitance proximity sensor devices have been widely adopted for several years, sensor designers continue to look for ways to improve the sensors' functionality and effectiveness. In particular, designers continually strive to simplify the design and implementation of position sensor devices without increasing costs. For example, in designing controllers for sensing capacitance it is desirable to minimize the number of pins required for implementation, as this reduces the overall cost of the device.

Accordingly, it is desirable to provide systems and methods for efficiently sensing capacitance in proximity sensor devices. In particular, systems and methods that will reduce the implementation costs. Other desirable features and characteristics will become apparent from the subsequent detailed description and the appended claims, taken in conjunction with the accompanying drawings and the foregoing technical field and background.

BRIEF SUMMARY OF THE INVENTION

The embodiments of the present invention provide systems and methods for sensing capacitances that are applicable to proximity sensor devices. The systems and methods provide reduced implementation costs by reducing the number of output terminals required. Specifically, the systems and methods for sensing capacitances provide the ability to selectively activate indicating transducers, such as light emitting diodes (LEDs), with the same output terminals used for sensing capacitances. This reduces the need for additional, dedicated output terminals for activating the indicating transducers. As such, the systems and methods provide for efficient use of resources in proximity sensor devices.

In a first embodiment, a capacitive sensor is provided that includes a first sensor electrode coupled to a first terminal, and a second sensor electrode coupled to a second terminal. Additionally, the capacitive sensor includes a first driver circuit coupled to the first terminal and a second driver circuit coupled to the second terminal. In a first mode, the first driver circuit and the second driver circuit are configured to drive the first terminal and the second terminal to substantially equal levels of electrical potential for sensing capacitances associated with the first electrode and the second electrode. In a second mode, the first driver circuit and the second driver circuit are configured to drive the first terminal and the second terminal to substantially different levels of electrical potential. These different levels of electrical potential are usable to activate an indicating transducer. Thus, the capacitive sensor utilizes the first and second terminals to both sense capacitance and drive the indicating transducer. This sharing of terminals reduces the need for dedicated terminals used only for activating a transducer.

In a variation on this embodiment, the first and second driving circuits are also configured to activate a second indicating transducer. For example, the second indicating transducer can be activated in a third mode, by driving the first terminal and the second terminal to second substantially different levels of electrical potential. This further sharing of the first and second terminals further reduces the need for dedicated terminals, and thus once again provides for efficient resource utilization.

A variety of different types of indicating transducers can be used in the embodiments of the invention. For example, both visual indicators, such as light emitting diodes, and acoustical indicators, such as piezoelectric acoustical devices can be utilized as indicating transducers.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The embodiments of the present invention provide systems and methods for sensing capacitances that are applicable to proximity sensor devices. The systems and methods provide reduced implementation costs by reducing the number of output terminals required. Specifically, the systems and methods for sensing capacitances provide the ability to selectively activate indicating transducers, such as LEDs, with the same output terminals used for sensing capacitances. This reduces the need for additional, dedicated output terminals for activating the indicating transducers. As such, the system and method provides for efficient use of resources in proximity sensor devices.

Figure 1:
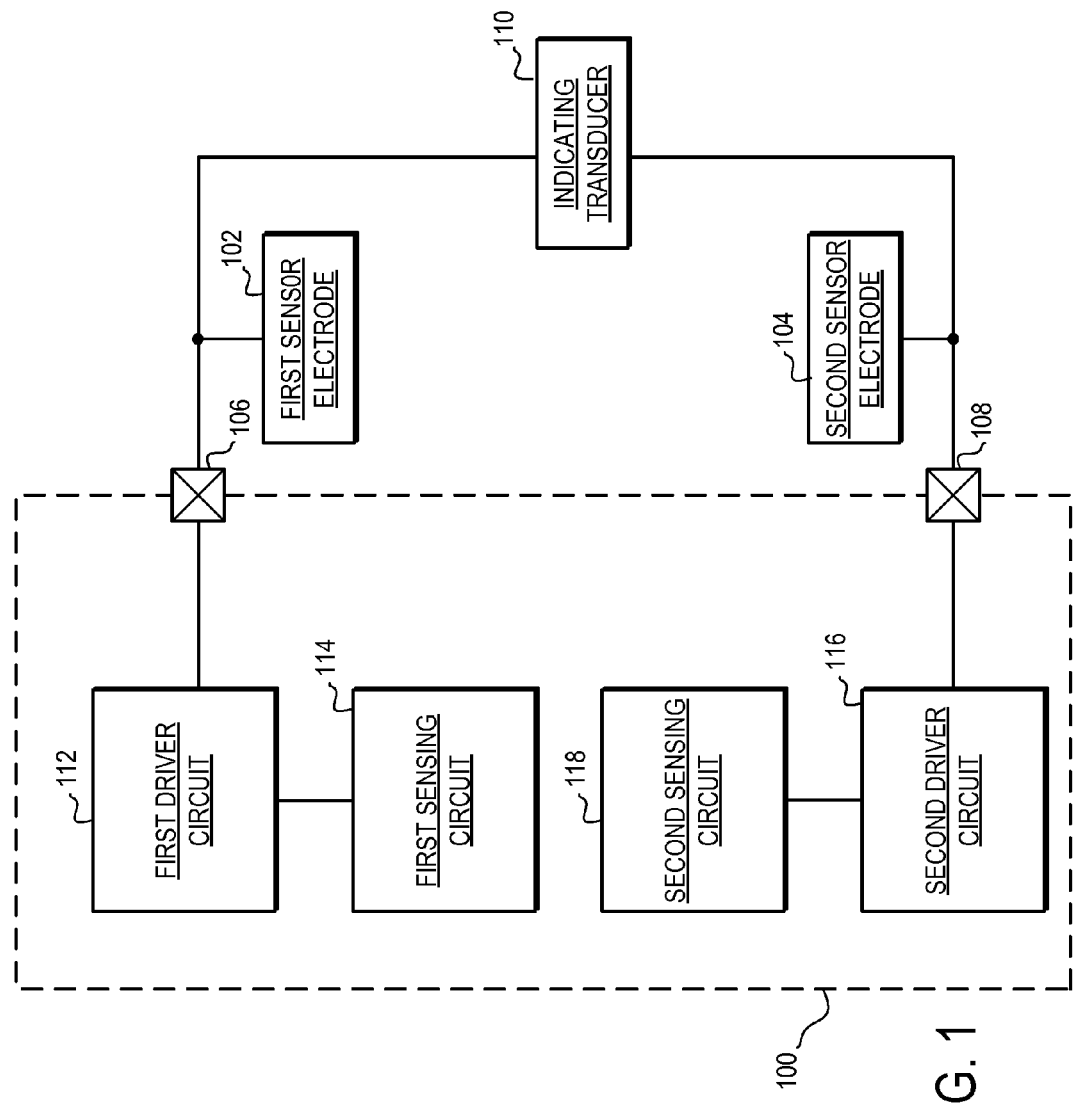
FIG. 1 is a schematic drawing of a capacitive sensor coupled to two sensing electrodes and an indicating transducer, in accordance with an embodiment of the invention.

Turning now to FIG. 1, a capacitive sensor 100 is illustrated schematically. In general, the capacitance sensor 100 provides the ability to determine the measurable capacitances associated with a first sensor electrode 102 and a second sensing electrode 104. The capacitances associated with these sensor electrodes can comprise the capacitance of the sensing electrode and a proximate conductive object, and can thus be used in capacitive proximity sensor devices such as touch pads.

The sensor electrodes 102 and 104 are coupled to the capacitance sensor 100 though output terminals 106 and 108 respectively. Also coupled to the capacitance sensor 100, again though output terminals 106 and 108, is an indicating transducer 110.

The capacitive sensor 100 includes a first driver circuit 112, a first sensing circuit 114, a second driver circuit 116, and a second sensing circuit 118. In a first mode, the first driver circuit 112 and the second driver circuit 116 are configured to drive the first terminal 106 and the second terminal 108 to substantially equal levels of electrical potential for sensing capacitances associated with the first sensor electrode 102 and the second sensor electrode 104.

The first sensing circuit 114 is coupled to the first driver circuit 112. During this first mode with substantially equal levels of electrical potential applied to the first and second terminals, the first sensing circuit 114 is configured to measure the charge transferred to the first sensor electrode 102. Likewise, the second sensing circuit 118 is coupled to the second driver circuit 116, and during this first mode the second sensing circuit 118 is configured to measure the charge transferred to the second sensor electrode 104. From the measurements of charge transferred to the first sensor electrode 102 and the second sensor electrode 104, the capacitive sensor 100 can determine a measurement of the capacitance associated with the first sensor electrode 102 and the second sensor electrode 104.

Furthermore, because during this first mode substantially equal levels of electrical potential are applied to both the first terminal 106 and the second terminal 108, no significant current will flow though the indicating transducer 110. The indicating transducer 110 thus will not activate, and its presence will not significantly impact the measurement of the charge transferred to the electrodes or the resulting determination of capacitances.

However, in a second mode, the first driver circuit 112 and the second driver circuit 116 are configured to drive the first terminal 106 and the second terminal 108 to substantially different levels of electrical potential. These different levels of electrical potential are usable to activate the indicating transducer 110. For example, where the indicating transducer comprises an LED, the different levels of electrical potential are driven such that the LED turns on.

Because the capacitance measurement does not occur during the second mode, the flow of current through the indicating transducer 110 does not negatively affect these measurements. Additionally, although the addition of the indicating transducer 110 can add parasitic capacitance to the circuit this will not significantly impact the performance of the sensor. Specifically, in the first mode no significant current flows through the indicating transducer 110, and thus the effect of the additional capacitance is minimal. When in the second mode current does flow through the indicating transducer 110, but since no capacitance measurement occurs in this mode the current does not impact the accuracy of the measurement.

Furthermore, it is noted that the capacitive sensor 100 utilizes the same two terminals (106 and 108) to both sense capacitance on the first sensor electrode 102, sense capacitance on the second sensor electrode 104, and to activate the indicating transducer 110. It should be noted that in this application, the term "terminal" is defined as an external connection point of an integrated circuit. Thus, terminals include connection structures such as pins, wires, pads and solder balls commonly found on integrated circuits. In many applications, the number of available connection points to the integrated circuit is a significant limiting factor. The sharing of terminals reduces the need for dedicated terminals used only for activating the transducer 110, and thus provides for efficient use of the limited number of terminals that are commonly available on an integrated circuit.

In this application, the term "indicating transducer" is defined to include any sort of device for converting energy to another form that can be observed by a user. For example, LED's convert electrical current to light, and thus an LED is one type of optical indicating transducer that can be used. Other types include piezoelectric acoustic devices that create sound when an appropriate current is provided. Other potential types include haptic devices that create vibration, and tactile devices that change the feel of a surface.

In general, the first sensor electrode 102 and the second sensor electrode 104 are conductive electrodes that provide measurable capacitances that vary with the proximity of conductive objects to the electrodes. In most sensing applications a set of sensor electrodes is formed together and used to detect object positional information through multiple measurements of capacitance for each electrode. The sensor electrodes 102 and 104 can be implemented with a variety of different conductive materials and structures. For example, a set of sensor electrodes can be formed on substrate using conductive ink deposition and patterning. The shape and arrangement of the sensor electrodes will generally depend on the specific application the sensor 100 is being implemented in. Furthermore, the electrodes can be implemented to provide a measurable capacitance that is measured between the electrode and a local ground, generally referred to as an "absolute capacitance". Alternatively, the electrodes can be implemented to provide a measurable capacitance that is measured between a driving electrode and a sensing electrode (while being affected by proximate objects), generally referred to as a "transcapacitance". In either case, charge is transferred to the sensor electrode using the driver circuit, with the amount of charge transferred being measured using the sensing circuit. The measurement of the transferred charge is used determine the measurable capacitance associated with the sensor electrode and any proximate conductive objects, and ultimately to provide positional information regarding those objects.

In general, the first driver circuit 112 and the second driver circuit 116 are configured to drive determined voltages on the first terminal 106 and second terminal 108. In a typically application, the voltages are driven as alternating waveforms, to facilitate repeated measurements of the capacitances associated with the sensor electrodes. In this embodiment, when in the first mode the waveforms applied to the first terminal 106 and second terminal 108 have substantially equal magnitudes, frequencies and phase, such that no substantially significant current flows through the indicating transducer 110. When such equal waveforms are applied, each period of high voltage is a time in which the charge transferred to the corresponding electrode can be measured, and the capacitance associated with the electrodes determined. In the second mode, substantially unequal waveforms are applied, a potential difference is applied to the indicating transducer 110, and current can flow through the transducer 110. This activates the transducer 110. For example, by applying a sufficient potential difference, an LED can be selectively activated.

In general, the first sensing circuit 114 and the second sensing circuit 118 are configured to measure the charge transferred to its corresponding sensor electrode during the first mode. A variety of different techniques can be used to measure the charge transferred. For example, a current integrator can be used to measure charge transferred using an integration of the current outputted by the driver circuit. As another example, a voltage integrator can be used to measure charge transferred using an integration of the voltage drop through a resistor. Both current integration and voltage integration are techniques for integrating the charge transferred to the electrode, and thus either can be used to determine the associated capacitances.

During operation of a typical proximity sensor device, the sensor 100 will repeatedly determine the measurable capacitance at the sensor electrodes 102 and 104. For example, a typical implementation can provide repeated measurements at a rate of 100 kHz. From those repeated cycles, the proximity sensor device can sense the changes in capacitance associated with proximate objects in a sensing region. Furthermore, in most typical proximity sensor devices, a plurality of sensing electrodes are used to provide positional information for objects that are in the sensing region. In these embodiments, the sensor device 100 would be implemented with a greater plurality of driving circuits and sensing circuits, and could also be coupled to a greater plurality of indicating transducers. For example, in some two-dimensional sensors, there could be tens of sensing electrodes, with their associated circuits used to repeatedly determine the associated measurable capacitances and thus provide precise positional information of proximate objects. Details of such devices will be discussed in greater detail below with reference to FIG. 6.

Figure 2:
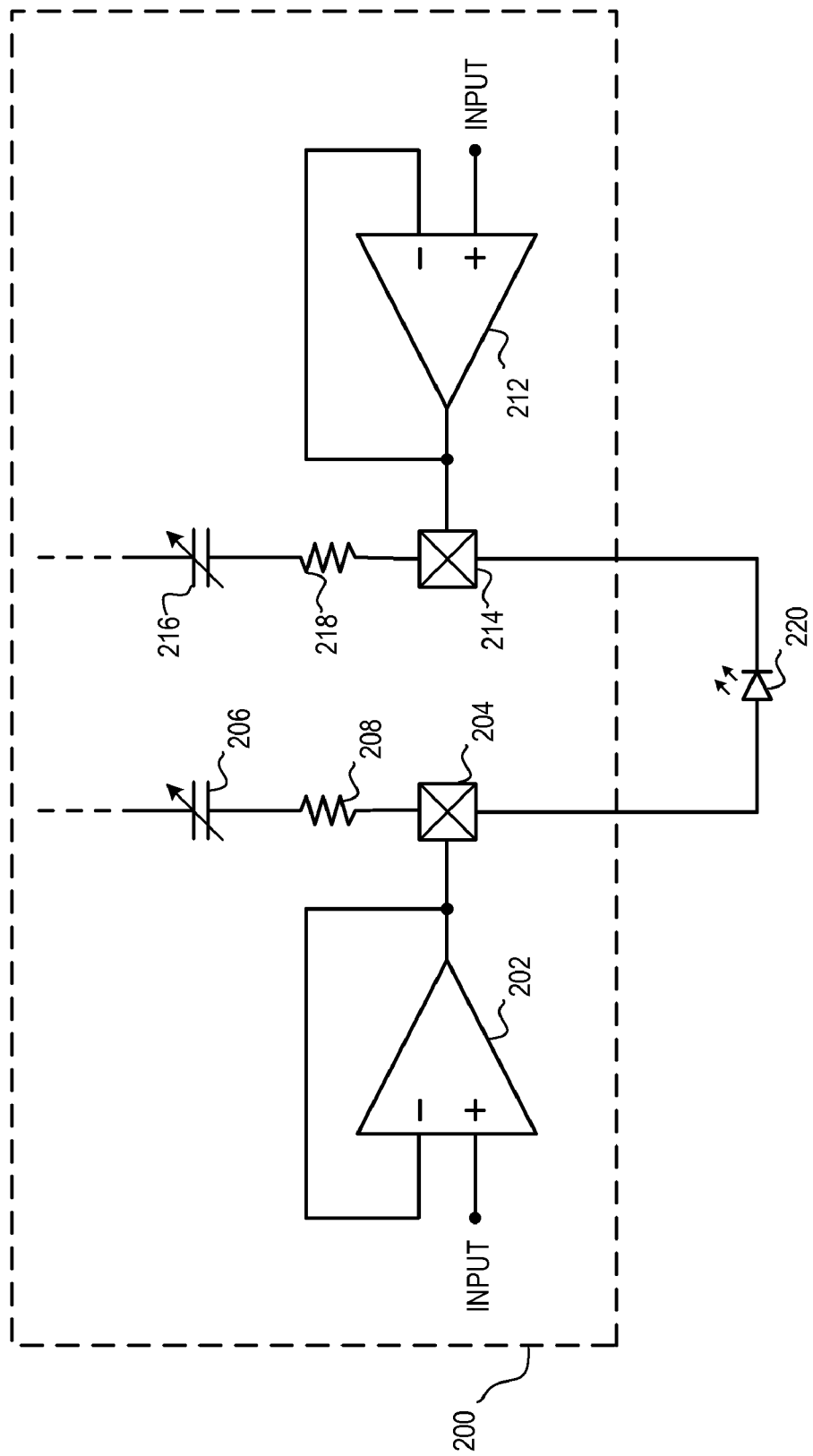
FIG. 2 is a schematic drawing of a specific embodiment of a capacitive sensor coupled to two sensing electrodes and an LED.

Turning now to FIG. 2, a first embodiment of a sensor device 200 is illustrated schematically. The sensor device 200 includes a first driver circuit, where the first driver circuit comprises a first amplifier 202 configured with negative feedback to drive a potential on a first terminal 204. The first terminal 204 is coupled to a first sensor electrode, illustrated as variable capacitance 206 and resistance 208.

The sensor device 200 also includes a second driver circuit, where the second driver circuit comprises a second amplifier 212 configured with negative feedback to drive a potential on a second terminal 214. The second terminal 214 is coupled to a second sensor electrode, illustrated as variable capacitance 216 and resistance 218.

Also coupled to the first terminal 204 and the second terminal 214 is an LED 220. The LED 220 is not part of the sensor device 220, but is selectively driven by it.

As described above, in a first mode the sensor device 200 operates to measure the capacitance associated with the sensor electrodes, illustrated as capacitances 206 and 216. In this mode, substantially equal potentials are applied to terminals 204 and 214. This can be accomplished by providing substantially identical waveforms to the inputs of first amplifier 202 and second amplifier 212. With no voltage difference between the terminals 204 and 214, substantially no current will flow through the parasitic junction capacitance of the LED 220. This preserves the accuracy of the capacitance measurements.

In the second mode, the sensor device 200 operates to activate the LED 220. In this mode, substantially unequal voltages are applied to terminals 204 and 214. This can be accomplished by providing DC voltages of different magnitudes to the inputs of the first amplifier 202 and the second amplifier 212. Alternatively, this can be accomplished by providing substantially out of phase waveforms to the inputs of the first amplifier 202 and the second amplifier 212. In either case, current flows through the LED 220 when the voltage difference is sufficient and the polarity correct (i.e., the voltage is higher at terminal 204 compared to terminal 214)

Again, the sensor device 200 utilizes the same two terminals 204 and 212 to sense capacitance and drive the indicating transducer. This sharing of terminals reduces the need for dedicated terminals used only for activating a transducer, and thus provides for efficient use of resources in proximity sensors.

Figure 3:
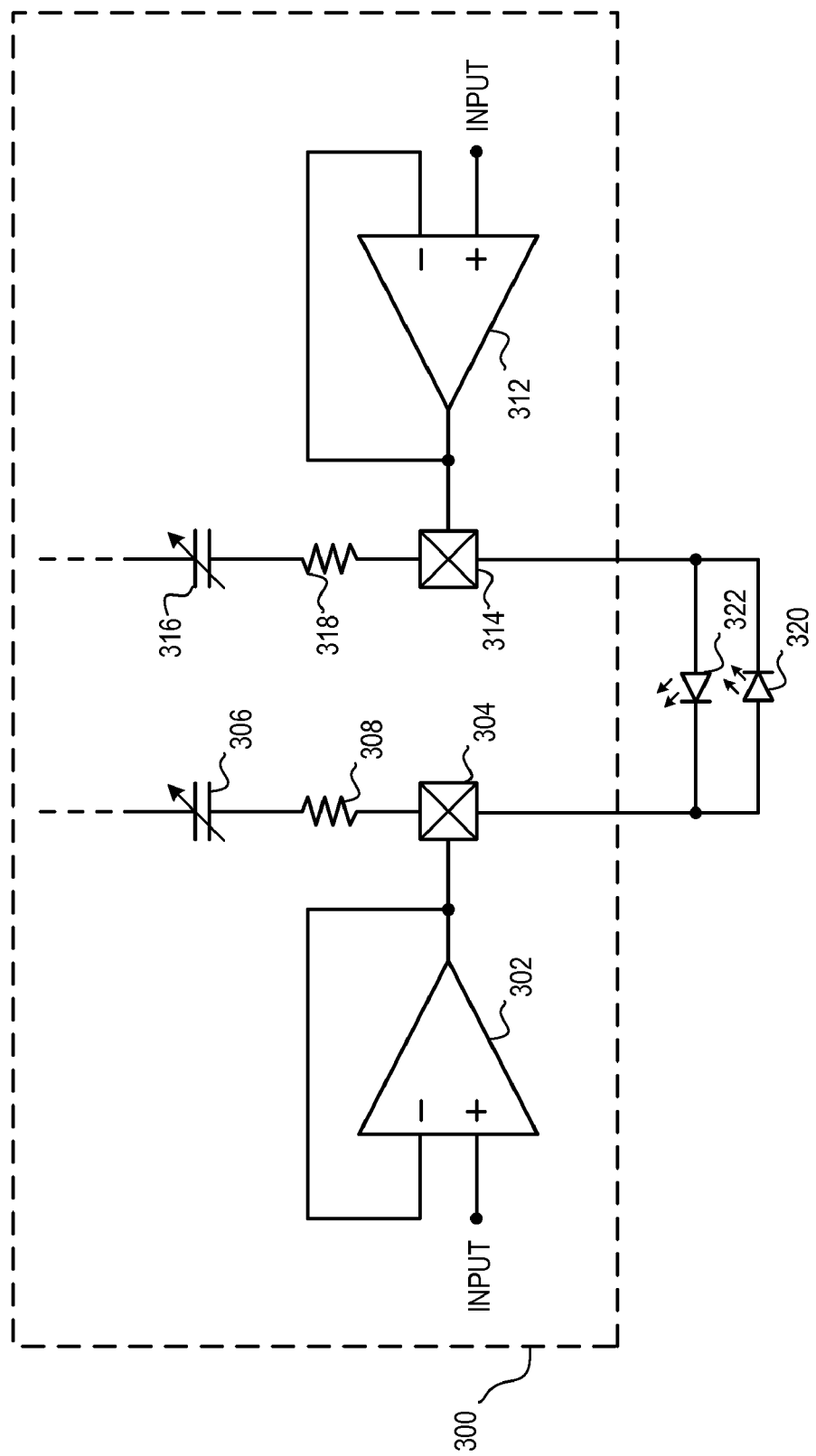
FIG. 3 is a schematic drawing of a specific embodiment of a capacitive sensor coupled to two sensing electrodes and to two LEDs.

Turning now to FIG. 3, a second embodiment of a sensor device 300 is illustrated schematically. The sensor device 300, like the device 200, includes a first driver circuit, where the first driver circuit comprises a first amplifier 302 configured with negative feedback to drive a potential on a first terminal 304. The first terminal 304 is coupled to a first sensor electrode, illustrated as variable capacitance 306 and resistance 308. Likewise, the sensor device 300 also includes a second driver circuit, where the second driver circuit comprises a second amplifier 312 configured with negative feedback to drive a potential on a second terminal 314. The second terminal 314 is coupled to a second sensor electrode, illustrated as variable capacitance 316 and resistance 318.

One difference in this embodiment is that the sensor device 300 includes two indicating transducers coupled to the first and second terminals. Specifically, configured to the first terminal 304 and the second terminal 314 is an LED 320 and an LED 330. Again, these LEDs are not part of the sensor device 320, but are selectively driven by it. The LEDs 320 and 330 are coupled to the terminals with opposite polarities. Thus, a sufficient voltage across the terminals with a higher potential at terminal 304 will activate LED 320. Conversely, a sufficient voltage across the terminals with a higher potential at terminal 314 will activate LED 322.

The sensor device 300 can thus operate in three modes. Again, in the first mode the sensor device 300 operates to measure the capacitance associated with the sensor electrodes, illustrated as capacitances 306 and 316. In this mode, substantially equal potentials are applied to terminals 304 and 314. With no voltage difference between the terminals 304 and 314, substantially no current will flow through either LED 320 or LED 322. This again preserves the accuracy of the capacitance measurements.

In the second mode, the sensor device 300 operates to activate the LED 320. In this mode, substantially unequal voltages are applied to terminals 304 and 314, with a higher voltage at terminal 304. This causes current to flow through LED 320, activating that LED. However, because the polarity of the second LED 322 is reversed, the second LED 322 will not activate.

In the third mode, the sensor device 300 operates to activate the LED 322. In this mode, substantially unequal voltages are applied to terminals 304 and 314, with a higher voltage at terminal 314. This results in a voltage difference across the terminals with a different polarity than that in the second mode. This causes current to flow through LED 322, activating that LED. However, because the polarity of the second LED 320 is reversed, the LED 320 will not activate.

Thus, the sensor device 300 utilizes the same two terminals 304 and 314 to sense capacitance, and selectively drive two different indicating transducers. This sharing of terminals reduces even further the need for dedicated terminals, and thus provides an even more efficient use of resources in proximity sensors.

A described above, in some embodiments sensing circuits are configured in the sensor to measure the charge transferred to its corresponding sensor electrode during the first mode. A variety of different techniques can be used to measure the charge transferred.

Figure 4:
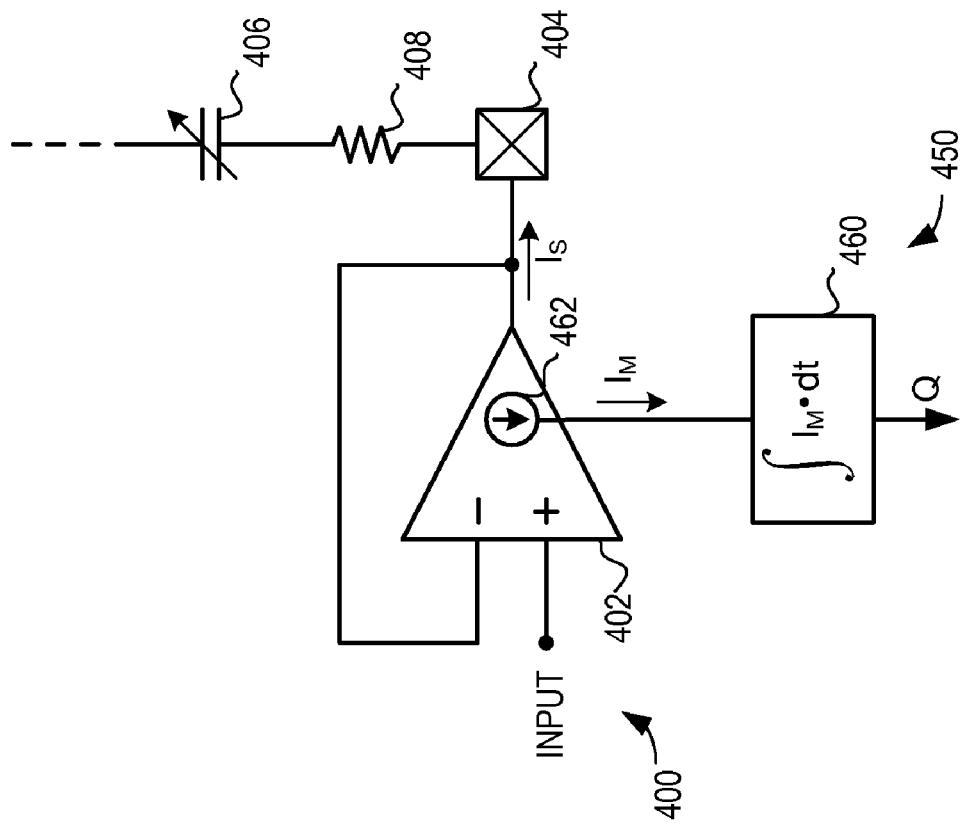
FIG. 4 is a schematic drawing of a driver circuit and a sensing circuit, where the sensing circuit utilizes a current integrator in accordance with the embodiments of the invention.

Turning now to FIG. 4, a portion of sensor device 400 is illustrated. The sensor device 400 again utilizes an amplifier 402 to drive electric potential on the terminal 404 for measuring the capacitance of a sensor electrode, again illustrated as variable capacitance 406 and resistance 408. In this illustrated embodiment, a sensing circuit 450 is used to measure the charge transferred to the sensor electrode. The sensing circuit 450 includes a current integrator 460 and a current mirror 462. The current mirror 462 measures the current provided by the output of the amplifier 402, and provides a proportional current $I_M$ to the current integrator 460. The current integrator 460 integrates the current $I_M$ over time. The integrated current $I_M$ provides a measure of the total charge outputted by the amplifier 402, and thus can be used to measure the capacitance 406.

Figure 5:
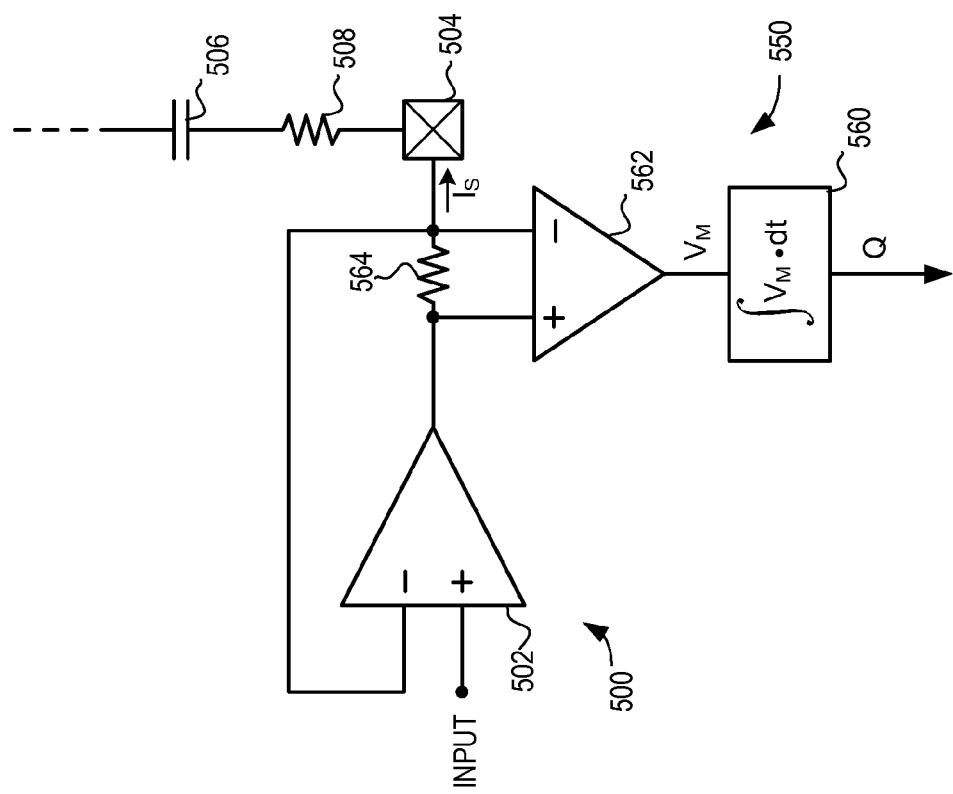
FIG. 5 is a schematic drawing of a driver circuit and a sensing circuit, where the sensing circuit utilizes a voltage integrator in accordance with the embodiments of the invention.

Turning now to FIG. 5, a portion of sensor device 500 is illustrated. The sensor device 500 again utilizes an amplifier 502 to drive electric potential on the terminal 504 for measuring the capacitance of a sensor electrode, again illustrated as variable capacitance 506 and resistance 508. In this illustrated embodiment, a sensing circuit 550 is used to measure the charge transferred to the sensor electrode.

In this embodiment, the sensing circuit 550 includes a voltage integrator 560, an amplifier 562, and a resistor 564. Current flowing through the output of the amplifier 502 generates a voltage drop across the resistor 564. That voltage drop is amplified by amplifier 562, which generates a voltage $V_M$ that is proportional to the current provided to the sensor electrode. The voltage integrator 560 integrates the voltage $V_M$ over time. The integrated voltage $V_M$ provides a measure of the total charge outputted by the amplifier 502, and thus can be used to measure the capacitance 506.

It should be noted that the embodiments illustrated in FIGS. 4 and 5 are only two simplified examples of the types of devices that can be used to measure charge transferred to the sensor electrode.

Figure 6:
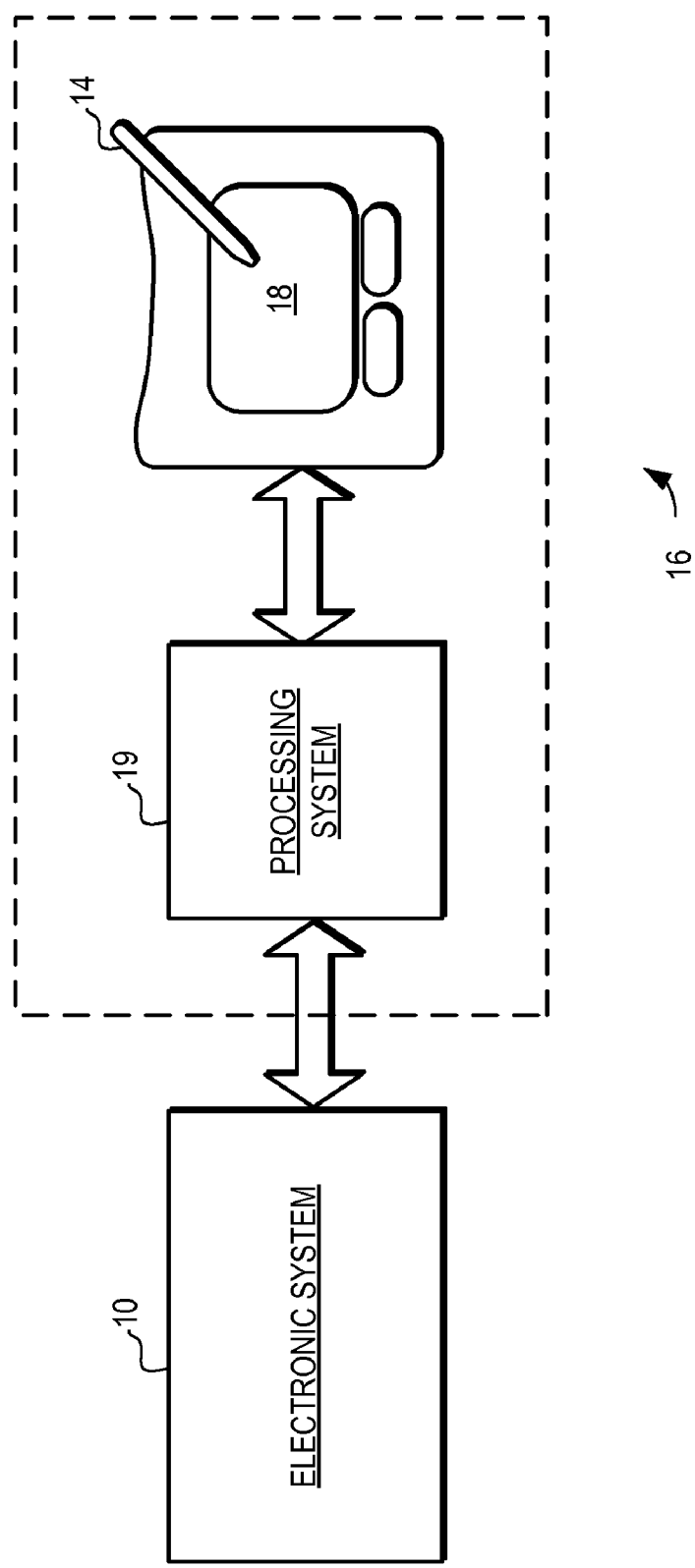
FIG. 6 is a schematic drawing of a capacitive measuring sensor in accordance with an embodiment of the invention.

Turning now to FIG. 6, a block diagram is illustrated of an exemplary electronic system 10 that operates with a capacitive proximity sensor device 16. The capacitive proximity sensor device 11 is an example of the type of device that can utilize the capacitive measurement devices and method described above.

Electronic system 10 is meant to represent any type of stationary or portable computer, including workstations, personal digital assistants (PDAs), video game players, communication devices (e.g., wireless phones and messaging devices), media device recorders and players (e.g., televisions, cable boxes, music players, and video players), digital cameras, video cameras, and other devices capable of accepting input from a user and of processing information. Accordingly, the various embodiments of system 10 may include any type of processing system, memory or display. Additionally, the elements of system 10 may communicate via any combination of protocol and connections, including buses, networks or other wired or wireless interconnections. Non-limiting examples of these include I2C, SPI, PS/2, Universal Serial Bus (USB), Bluetooth, RF, IRDA.

The proximity sensor device 16 has a sensing region 18 and is implemented with a processing system 19. The proximity sensor device 16 is sensitive to positional input, such as the position or motion of one or more input objects within the sensing region 18. A stylus 114 is shown in FIG. 6 as an exemplary input object, and other examples include a finger (not shown). "Sensing region" 118 as used herein is intended to broadly encompass any space above, around, in and/or near the proximity sensor device 16 wherein the sensor is able to detect an input object. In a conventional embodiment, sensing region 18 extends from a surface of the proximity sensor device 16 in one or more directions into space until the noise and decreased signal prevent accurate object detection. This distance may be on the order of less than a millimeter, millimeters, centimeters, or more, and may vary significantly with the type of capacitive sensing technology used and the accuracy desired. Embodiments of the proximity sensor device 16 may require contact with a surface, either with or without applied pressure. Accordingly, the planarity, size, shape and exact locations of the particular sensing region 18 can vary widely from embodiment to embodiment.

In capacitive proximity sensors as an example, sensing regions with rectangular projected shape are common, and many other shapes are possible. For example, depending on the design of the sensor array and surrounding circuitry, shielding from any input objects, and the like, sensing region 18 can be made to have two-dimensional projections of other shapes. Similar approaches can be used to define the three-dimensional shape of the sensing region. For example, any combination of sensor design, shielding, signal manipulation, and the like can effectively define a sensing region that extends a short or a long distance in the third dimension (i.e., out of the page) in FIG. 6. With a sensing region that extends almost no distance from an associated surface of the proximity sensor device, input may be recognized and acted upon only when there is physical contact between any input objects and the associated surface. Alternatively, the sensing region may be made to extend a long distance, such that an input object positioned some distance away from a defined surface of proximity sensor device may still be recognized and acted upon. Therefore, interaction with a proximity sensor device may be either through contact or through non-contact proximity.

In operation, the proximity sensor device 16 suitably detects positional information of one or more input objects within sensing region 18 using capacitive techniques and structures. Capacitive techniques are advantageous over ones requiring moving mechanical structures (e.g. mechanical switches) that more easily wear out over time. In a common capacitive implementation of the proximity sensor device 16, a voltage or current is applied to create an electric field about a surface. A capacitive proximity sensor device would then detect positional by detecting changes in capacitance reflective of the changes in the electric field due to the object. Examples of technologies that can be used to implement the various embodiments of the invention can be found at U.S. Pat. No. 5,543,591, U.S. Pat. No. 6,259,234 and U.S. Pat. No. 5,815,091, each assigned to Synaptics Inc.

The proximity sensor device 16 can include one or more sensing region 18 supported by any appropriate proximity sensing technology. For example, the proximity sensor device 16 can use arrays of capacitive sensor electrodes to support any number of sensing region 18. As another example, the proximity sensor device 16 can use capacitive sensing technology in combination with resistive sensing technology to support the same sensing region 18 or to support separate sensing region 18.

The processing system 19 is coupled to the proximity sensor device 16 and the electronic system 10. The processing system 19 can perform a variety of processes on the signals received from the sensor to implement the proximity sensor device 16. For example, the processing system 19 can select or connect individual sensor electrodes, detect presence/proximity, calculate position or motion information, or interpret object motion as gestures.

In some embodiments, the proximity sensor device 16 uses processing system 19 to provide electronic indicia of positional information to the electronic system 10. The system 10 appropriately processes the indicia to accept inputs from the user, to move a cursor or other object on a display, or for any other purpose. With such embodiment, processing system 19 can report positional information to electronic system 10 constantly, when a threshold is reached, or in response some criterion such as an identified stroke of object motion. In other embodiments, the processing system 19 directly processes the indicia to accept inputs from the user, to move a cursor or other object on a display, or for any other purpose based on any number and variety of criteria.

In this specification, the term "processing system" includes any number of processing elements appropriate to perform the recited operations. Thus, the processing system 19 can comprise any number of discrete components, any number of integrated circuits, firmware code, and/or software code—whatever is needed to perform the recited operations. In some embodiments, all processing elements that comprise the processing system 19 are located together, in or near the proximity sensor device 16. In other embodiments, these elements would be physically separated, with some elements of the processing system 19 close to a sensor, of sensor device 16, and some elsewhere (such as near other circuitry for the electronic system 10). In this latter embodiment, minimal processing could be performed by the elements near the sensor, and the majority of the processing could be performed by the elements elsewhere.

Furthermore, the processing system 19 can communicate with some part of the electronic system 10, and be physically separate from or physically integrated with that part of the electronic system. For example, the processing system 19 can reside at least partially on a microprocessor for performing functions for the electronic system 10 aside from implementing the proximity sensor device 16.

As used in this application, the terms "electronic system" and "electronic device" broadly refer to any type of device that operates with proximity sensor device 16. The electronic system 10 could thus comprise any type of device or devices in which a proximity sensor device 16 can be implemented in or coupled to. The proximity sensor device 16 thus could be implemented as part of the electronic system 10, or coupled to the electronic system 10 using any suitable technique. As non-limiting examples, the electronic system 10 could thus comprise any type of computing device listed above or another input device (such as a physical keypad or another touch sensor device). In some cases, the electronic system 10 is itself a peripheral to a larger system. For example, the electronic system 10 could be a data input device such as a remote control, or a data output device such as a display system, that communicates with a computing system using a suitable wired or wireless technique. It should also be noted that the various elements (any processors, memory, etc.) of the electronic system 10 could be implemented as part of the proximity sensor device 16, as part of a larger system, or as a combination thereof. Additionally, the electronic system 10 could be a host or a slave to the proximity sensor device 16.

In some embodiments the proximity sensor device 16 is implemented with buttons or other input devices near the sensing region 18. The buttons can be implemented to provide additional input functionality to the proximity sensor device 16. For example, the buttons can be used to facilitate selection of items using the proximity sensor device. Of course, this is just one example of how additional input functionality can be added to the proximity sensor device 16, and in other implementations the proximity sensor device 16 could include alternate or additional input devices, such as physical or virtual switches, or additional proximity sensing regions. Conversely, the proximity sensor device 16 can be implemented with no additional input devices.

Likewise, the positional information determined the processing system 19 can be any suitable indicia of object presence. For example, the processing system 19 can be implemented to determine "zero-dimensional" 1-bit positional information (e.g. near/far or contact/no contact) or "one-dimensional" positional information as a scalar (e.g. position or motion along a sensing region). Processing system 19 can also be implemented to determine multi-dimensional positional information as a combination of values (e.g. two-dimensional horizontal/vertical axes, three-dimensional horizontal/vertical/depth axes, angular/radial axes, or any other combination of axes that span multiple dimensions), and the like. Processing system 19 can also be implemented to determine motion information about time or history.

Furthermore, the term "positional information" as used herein is intended to broadly encompass absolute and relative position-type information, and also other types of spatial-domain information such as velocity, acceleration, and the like, including measurement of motion in one or more directions. Various forms of positional information may also include time history components, as in the case of gesture recognition and the like. As will be described in greater detail below, the positional information from the processing system 19 facilitates a full range of interface inputs, including use of the proximity sensor device as a pointing device for cursor control, scrolling, and other functions.

In some embodiments, the proximity sensor device 16 is adapted as part of a touch screen interface. Specifically, the proximity sensor device is combined with a display screen that is overlapped by at least a portion of the sensing region 18. Together the proximity sensor device 16 and the display screen provide a touch screen for interfacing with the electronic system 10. The display screen can be any type of electronic display capable of displaying a visual interface to a user, and can include any type of LED (including organic LED (OLED)), CRT, LCD, plasma, EL or other display technology. When so implemented, the proximity sensor device 16 can be used to activate functions on the electronic system 10, such as by allowing a user to select a function by placing an input object in the sensing region proximate an icon or other user interface element that is associated with or otherwise identifies the function. The user's placement of the object can thus identify the function to the electronic system 10. Likewise, the proximity sensor device 16 can be used to facilitate user interface interactions, such as button functions, scrolling, panning, menu navigation, cursor control, and the like. As another example, the proximity sensor device can be used to facilitate value adjustments, such as by enabling changes to a device parameter. Device parameters can include visual parameters such as color, hue, brightness, and contrast, auditory parameters such as volume, pitch, and intensity, operation parameters such as speed and amplification. In these examples, the proximity sensor device is used to both activate the function and then to perform the adjustment, typically through the use of object motion in the sensing region 18.

It should also be understood that the different parts of the overall device can share physical elements extensively. For example, some display and proximity sensing technologies can utilize the same electrical components for displaying and sensing. One implementation can use an optical sensor array embedded in the TFT structure of LCDs to enable optical proximity sensing through the top glass of the LCDs. Another implementation can use a resistive touch-sensitive mechanical switch into the pixel to enable both display and sensing to be performed by substantially the same structures.

It should also be understood that while the embodiments of the invention are to be described herein the context of a fully functioning proximity sensor device, the mechanisms of the present invention are capable of being distributed as a program product in a variety of forms. For example, the mechanisms of the present invention can be implemented and distributed as a proximity sensor program on a computer-readable signal bearing media. Additionally, the embodiments of the present invention apply equally regardless of the particular type of computer-readable signal bearing media used to carry out the distribution. Examples of signal bearing media include: recordable media such as memory sticks/cards/modules and disk drives, which may use flash, optical, magnetic, holographic, or any other storage technology.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A capacitive sensor comprising:
a first sensor electrode coupled to a first terminal;
a second sensor electrode coupled to a second terminal;
a first driver circuit coupled to the first terminal and a second driver circuit coupled to the second terminal, where in a first mode the first driver circuit and the second driver circuit are configured to drive the first terminal and the second terminal to substantially equal levels of electrical potential for sensing capacitances associated with the first sensor electrode and the second sensor electrode, and where in a second mode the first driver circuit and the second driver circuit are configured to drive the first terminal and the second terminal to first substantially different levels of electrical potential for activating an indicating transducer that is capable of being coupled between the first terminal and the second terminal.

2. The capacitive sensor of claim 1 wherein the indicating transducer is selected from the group consisting of a light emitting diode (LED) and a piezoelectric device.

3. The capacitive sensor of claim 1 where in a third mode the first driver circuit and the second driver circuit are configured to drive the first terminal and the second terminal to second substantially different levels of electrical potential for activating a second indicating transducer that is capable of being coupled between the first terminal and the second terminal.

4. The capacitive sensor of claim 3 where the second substantially different levels of electrical potential have a polarity different from the first substantially different levels of electrical potential.

5. The capacitive sensor of claim 1 further comprising a first sensor circuit coupled to the first driver circuit and configured to measure charge transferred to the first sensor electrode during the first mode, and further comprising a second sensor circuit coupled to the second driver circuit and configured to measure charge transferred to the second sensor electrode during the first mode.

6. The capacitive sensor of claim 5 wherein the first sensor circuit comprises a first current integrator to measure charge transferred to the first sensor electrode during the first mode, and wherein the second sensor circuit comprises a second current integrator to measure charge transferred to the second sensor electrode during the first mode.

7. The capacitive sensor of claim 5 wherein the first sensor circuit comprises a first voltage integrator to measure charge transferred to the first sensor electrode during the first mode, and wherein the second sensor circuit comprises a second voltage integrator to measure charge transferred to the second sensor electrode during the first mode.

8. The capacitive sensor of claim 1 wherein the first driver circuit and the second driver circuit are configured to drive the first terminal and the second terminal to substantially equal levels of electrical potential using alternating waveforms that are in phase.

9. The capacitive sensor of claim 1 wherein the first driver circuit and the second driver circuit are configured to drive the first terminal and the second terminal to substantially different levels of electrical potential using alternating waveforms that are out of phase.

10. An apparatus comprising:
an LED having a first node and a second node;
a first capacitive sensor electrode;
a second capacitive sensor electrode;
a proximity sensor controller having a first output terminal and a second output terminal, the first output terminal coupled the first node of the LED and the first capacitive sensor electrode, the second output terminal coupled to the second node of the LED and the second capacitive sensor electrode, the proximity sensor controller further comprising:
a first driver circuit coupled to the first output terminal, the first driver circuit configured to drive the first output terminal;
a first sensing circuit coupled to the first driver circuit, the first sensing circuit configured to measure charge transferred to the first electrode to determine a first capacitance associated with the first sensor electrode;

a second driver circuit coupled to the second output terminal, the second driver circuit configured to drive the second output terminal;

a second sensing circuit coupled to the second driver circuit, the second sensing circuit configured to measure charge transferred to the second sensor electrode to determine a second capacitance associated with the second sensor electrode; and where in a first mode for measuring the first capacitance and the second capacitance, the first driver circuit and the second driver circuit are configured to drive the first output terminal and the second output terminal to substantially equal levels of electric potential, and where in a second mode for activating the LED, the first driver circuit and the second driver circuit are configured to drive the first output terminal and the second output terminal to substantially different levels of electric potential.

11. A method comprising:

applying substantially equal levels of electric potential to a first output terminal and a second output terminal for measuring a first capacitance associated with a first electrode coupled to the first output terminal and measuring a second capacitance associated with a second electrode coupled to the second output terminal; and applying a first set of substantially different levels of electric potential to the first output terminal and the second output terminal for activating an indicating transducer coupled between the first output terminal and the second output terminal.

12. The method of claim 11 wherein the indicating transducer indicating transducer is selected from the group consisting of a light emitting diode (LED) and a piezoelectric device.

13. The method of claim 11 further comprising:

applying a second set of substantially different levels of electric potential to the first output terminal and the second output terminal for activating a second indicating transducer coupled between the first output terminal and the second output terminal.

14. The method of claim 13 where the second set of substantially different levels of electrical potential have polarities different from the first set of substantially different levels of electrical potential.

15. The method of claim 11 further comprising:

measuring charge transferred to the first electrode during the applying substantially equal levels of electric potential to the first output terminal and the second output terminal; and measuring charge transferred to the second electrode during applying substantially equal levels of electric potential to the first output terminal and the second output terminal.

16. The method of claim 15 wherein the measuring charge transferred to the first electrode comprises performing a first current integration, and wherein the measuring charge transferred to the second electrode comprises performing a second current integration.

17. The method of claim 15 wherein the measuring charge transferred to the first electrode comprises performing a first voltage integration, and wherein the measuring charge transferred to the second electrode comprises performing a second voltage integration.

18. The method of claim 11 wherein the applying substantially equal levels of electric potential to a first output terminal and a second output terminal comprises applying alternating waveforms that are in phase.

19. The method of claim 11 wherein the applying substantially different levels of electric potential to the first output terminal and the second output terminal comprises applying alternating waveforms that are out of phase.

20. An apparatus comprising:

an indicating transducer including a first node and a second node;

a first capacitive sensor electrode;

a second capacitive sensor electrode;

a first driver circuit coupled to a first terminal and a second driver circuit coupled to a second terminal, the first terminal coupled the first node of the indicating transducer and the first capacitive sensor electrode, the second terminal coupled to the second node of the indicating transducer and the second capacitive sensor electrode, where in a first mode the first driver circuit and the second driver circuit are configured to drive the first terminal and the second terminal to substantially equal levels of electrical potential for sensing capacitances associated with the first sensor electrode and the second sensor electrode, and where in a second mode the first driver circuit and the second driver circuit are configured to drive the first terminal and the second terminal to first substantially different levels of electrical potential for activating the indicating transducer.

21. The apparatus of claim 20 further comprising a second indicating transducer including a first node and a second node, wherein the first node of the second indicating transducer is coupled to the first terminal, and wherein the second node of the second indicating transducer is coupled to the second node, and where in a third mode the first driver circuit and the second driver circuit are configured to drive the first terminal and the second terminal to second substantially different levels of electrical potential for activating the second indicating transducer.

22. The apparatus of claim 21 where the second substantially different levels of electrical potential have a polarity different from the first substantially different levels of electrical potential.

23. The apparatus of claim 20 further comprising a first sensor circuit coupled to the first driver circuit and configured to measure charge transferred to the first sensor electrode during the first mode, and further comprising a second sensor circuit coupled to the second driver circuit and configured to measure charge transferred to the second sensor electrode during the first mode.

24. The apparatus of claim 20 wherein the first driver circuit and the second driver circuit are configured to drive the first terminal and the second terminal to substantially equal levels of electrical potential using alternating waveforms that are in phase, and wherein the first driver circuit and the second driver circuit are configured to drive the first terminal and the second terminal to substantially different levels of electrical potential using alternating waveforms that are out of phase.

* * * * *